United States Patent
Zuo et al.

(10) Patent No.: US 9,634,640 B2
(45) Date of Patent: Apr. 25, 2017

(54) TUNABLE DIPLEXERS IN THREE-DIMENSIONAL (3D) INTEGRATED CIRCUITS (IC) (3DIC) AND RELATED COMPONENTS AND METHODS

(71) Applicant: QUALCOMM Incorporated, San Diego, CA (US)

(72) Inventors: Chengjie Zuo, Santee, CA (US); Daeik D. Kim, San Diego, CA (US); Je-Hsiung Lan, San Diego, CA (US); Jonghae Kim, San Diego, CA (US); Mario Francisco Velez, San Diego, CA (US); Changhan Yun, San Diego, CA (US); David F. Berdy, West Lafayette, IN (US); Robert P. Mikulka, Oceanside, CA (US); Matthew M. Nowak, San Diego, CA (US); Xiangdong Zhang, Westford, MA (US); Puay H. See, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 50 days.

(21) Appl. No.: 13/887,568

(22) Filed: May 6, 2013

(65) Prior Publication Data

US 2014/0327496 A1    Nov. 6, 2014

(51) Int. Cl.
*H03H 7/46*    (2006.01)

(52) U.S. Cl.
CPC ........ *H03H 7/463* (2013.01); *Y10T 29/49016* (2015.01)

(58) Field of Classification Search
CPC ........... H03H 7/461; H03H 7/463; H03H 3/00
(Continued)

(56) References Cited

U.S. PATENT DOCUMENTS 2,757,320 A * 7/1956 Schuh, Jr. ...................... 361/183
3,656,162 A * 4/1972 Mee .............................. 370/339
(Continued)

FOREIGN PATENT DOCUMENTS

DE    102006058068 A1    6/2008
DE    102008003952 A1    7/2008
(Continued)

OTHER PUBLICATIONS

Distortion-free varactor diode topologies for RF adaptivity Buisman et al , Distortion free Varactor diode topologies for RF adaptivity, 2005 Microwave Symposium Digest, 2005 , IEEE MTT-S International, pp. 157-160.*

(Continued)

*Primary Examiner* — Robert Pascal
*Assistant Examiner* — Kimberly Glenn
(74) *Attorney, Agent, or Firm* — Withrow & Terranova, PLLC

(57) ABSTRACT

Tunable diplexers in three-dimensional (3D) integrated circuits (IC) (3DIC) are disclosed. In one embodiment, the tunable diplexer may be formed by providing one of either a varactor or a variable inductor in the diplexer. The variable nature of the varactor or the variable inductor allows a notch in the diplexer to be tuned so as to select a band stop to eliminate harmonics at a desired frequency as well as control the cutoff frequency of the pass band. By stacking the elements of the diplexer into three dimensions, space is conserved and a variety of varactors and inductors are able to be used.

19 Claims, 6 Drawing Sheets

(58) Field of Classification Search
USPC .......................................................... 333/17.1
See application file for complete search history.

(56) References Cited

U.S. PATENT DOCUMENTS

| | | | |
|---|---|---|---|
| 5,548,255 | A | 8/1996 | Spielman |
| 5,696,471 | A | 12/1997 | Fujiwara |
| 5,815,052 | A | 9/1998 | Nakajima et al. |
| 5,886,597 | A | 3/1999 | Riad |
| 6,180,976 | B1 | 1/2001 | Roy |
| 6,366,564 | B1 | 4/2002 | Hiraka et al. |
| 6,417,754 | B1 * | 7/2002 | Bernhardt ............... H01F 5/003 257/E21.022 |
| 6,597,258 | B2 | 7/2003 | Rosenbaum |
| 6,597,315 | B2 | 7/2003 | Yokoshima et al. |
| 7,498,918 | B2 | 3/2009 | Hsu et al. |
| 7,564,319 | B2 | 7/2009 | Ding et al. |
| 7,586,755 | B2 | 9/2009 | Satoh et al. |
| 7,678,695 | B2 | 3/2010 | Taniguchi et al. |
| 7,821,359 | B2 | 10/2010 | Hart |
| 7,924,116 | B2 | 4/2011 | Ono et al. |
| 8,060,673 | B2 | 11/2011 | Lu et al. |
| 8,069,560 | B2 | 12/2011 | Mori et al. |
| 8,143,952 | B2 | 3/2012 | Kim et al. |
| 8,324,984 | B2 | 12/2012 | Gavin et al. |
| 8,339,233 | B2 | 12/2012 | Tsai et al. |
| 8,362,591 | B2 | 1/2013 | Yen et al. |
| 8,736,399 | B2 | 5/2014 | Solski et al. |
| 8,803,615 | B2 * | 8/2014 | Cabanillas et al. ........... 330/305 |
| 2001/0044292 | A1 | 11/2001 | Jeon et al. |
| 2004/0124961 | A1 | 7/2004 | Aoyagi |
| 2004/0238644 | A1 | 12/2004 | Leaming |
| 2005/0240695 | A1 | 10/2005 | Leaming |
| 2008/0121417 | A1 | 5/2008 | Fan |
| 2008/0166980 | A1 | 7/2008 | Fukamachi et al. |
| 2009/0219908 | A1 | 9/2009 | Rofougaran |
| 2009/0225525 | A1 | 9/2009 | Mano et al. |
| 2009/0280865 | A1 | 11/2009 | Danis et al. |
| 2010/0095063 | A1 | 4/2010 | Koraichi et al. |
| 2010/0289126 | A1 | 11/2010 | Pagaila et al. |
| 2011/0095395 | A1 | 4/2011 | Ellul et al. |
| 2011/0110385 | A1 | 5/2011 | Gorostegui et al. |
| 2011/0248405 | A1 | 10/2011 | Li et al. |
| 2011/0291786 | A1 * | 12/2011 | Li et al. ......................... 336/200 |
| 2012/0075216 | A1 | 3/2012 | Black et al. |
| 2012/0080771 | A1 | 4/2012 | Yang et al. |
| 2012/0302188 | A1 | 11/2012 | Sahota et al. |
| 2013/0011995 | A1 | 1/2013 | Watanabe |
| 2013/0207745 | A1 | 8/2013 | Yun et al. |
| 2013/0223412 | A1 | 8/2013 | Sambhwani |
| 2014/0197902 | A1 | 7/2014 | Zuo et al. |
| 2014/0268616 | A1 | 9/2014 | Lan et al. |
| 2016/0204758 | A1 | 7/2016 | Zuo et al. |

FOREIGN PATENT DOCUMENTS

| | | |
|---|---|---|
| EP | 1079520 A2 | 2/2001 |
| EP | 1276152 A2 | 1/2003 |
| EP | 1411553 A1 | 4/2004 |
| EP | 1833286 A1 | 9/2007 |
| JP | S5291446 U | 7/1977 |
| JP | H0945866 A | 2/1997 |
| JP | 2001119209 A | 4/2001 |
| JP | 2001136045 A | 5/2001 |
| JP | 2002008942 A | 1/2002 |
| JP | 2003100553 A | 4/2003 |
| JP | 200314592 A | 5/2003 |
| JP | 2004087971 A | 3/2004 |
| JP | 2004281850 A | 10/2004 |
| JP | 2006279604 A | 10/2006 |
| WO | 9923702 A1 | 5/1999 |
| WO | 2007061308 A1 | 5/2007 |
| WO | 2008069783 A1 | 6/2008 |
| WO | 2009118694 A1 | 10/2009 |
| WO | 2009128047 A1 | 10/2009 |
| WO | 2010107430 A1 | 9/2010 |
| WO | 2011044392 A1 | 4/2011 |
| WO | 2012144482 A1 | 10/2012 |

OTHER PUBLICATIONS

Buisman, et al., ""Distortion-Free" Varactor Diode Topologies for RF Adapativity," 2005 IEEE MTT-S International Microwave Symposium Digest, 2005, pp. 157-160.

Co-pending U.S. Appl. No. 13/798,733, filed Mar. 13, 2013.

Co-pending U.S. Appl. No. 14/019,821, filed Sep. 6, 2013.

Buisman, Koen et al., "A Monolithic Low-Distortion Low-Loss Silicon-on-Glass Varactor-Tuned Filter with Optimized Biasing," IEEE Microwave and Wireless Components Letters, vol. 17, No. 1, Jan. 2007, IEEE, pp. 58-60.

International Search Report and Written Opinion for Patent Application No. PCT/US2014/036524, mailed Aug. 22, 2014, 13 pages.

Kim, Tae Wan et al., "A Compact Sized LTCC Diplexer with High-Band Selectivity and High Isolation for GSM and CDMA Multi-band Applications," 2009 APMC Microwave Conference, Dec. 2009, IEEE, pp. 2080-2083.

Liu, Kai et al., "Investigation of Integrated Passive Device with Through-Silicon Via," 2012 IEEE 62nd Electronic Components and Technology Conference (ECTC), May 29-Jun. 1, 2012, IEEE, pp. 1833-1839.

Methot F., "Constant Impedance Bandpass and Diplexer Filters," RF Design, vol. 9, No. 11, Nov. 1986, Primedia Business Magazine and Media, 3 pages.

Saitou, K. et al., "Tunable Duplexer Having Multilayer Structure Using LTCC," 2003 IEEE MTT-S International Microwave Symposium Digest, Jun. 8-13, 2003, Philadelphia, PA, IEEE, pp. 1763-1766.

Sakhnenko S., et al., "Ultra-Low-Profile Small-Size LTCC Front-End Module (FEM) for WLAN Applications Based on a Novel Diplexer Design Approach," IEEE MTT-S International Microwave Symposium Digest, Jun. 7-12, 2009, IEEE, pp. 609-612.

Sridharan, Vivek et al., "Design and Fabrication of Bandpass Filters in Glass Interposer with Through-Package-Vias (TPV)," 2010 Proceedings 60th Electronic Components and Technology Conference (ECTC), Jun. 1, 2010, IEEE, pp. 530-535.

Sun, Liguo et al., "System Integration Using Silicon-Based Integrated Passive Device Technology," 2012 IEEE International Symposium on Radio-Frequency Integration Technology (RFIT), Nov. 21-23, 2012, IEEE, pp. 98-100.

Vitale W.A., et al., "High-Q 3D Embedded Inductors Using TSV for RF MEMS Tunable Bandpass Filters (4.65-6.8 GHz)," IEEE European Microwave Integrated Circuits Conference, Oct. 29-Nov. 1, 2012, IEEE, pp. 822-825.

International Preliminary Report on Patentability for Patent Application No. PCT/US2014/036524, mailed Jul. 23, 2015, 19 pages.

Second Written Opinion for Patent Application No. PCT/US2014/036524, mailed May 4, 2015, 8 pages.

Shariff D., et al., "Integration of fine-pitched Through-Silicon Vias and Integrated Passive Devices", IEEE 61st Electronic Components and Technology Conference (ECTC), May 31-Jun. 3, 2011, Lake Buena Vista, FL, IEEE, pp. 844-848.

Notice of Reasons for Rejection for Japanese Patent Application No. 2016-518371, mailed Jul. 11, 2016, 10 pages.

\* cited by examiner

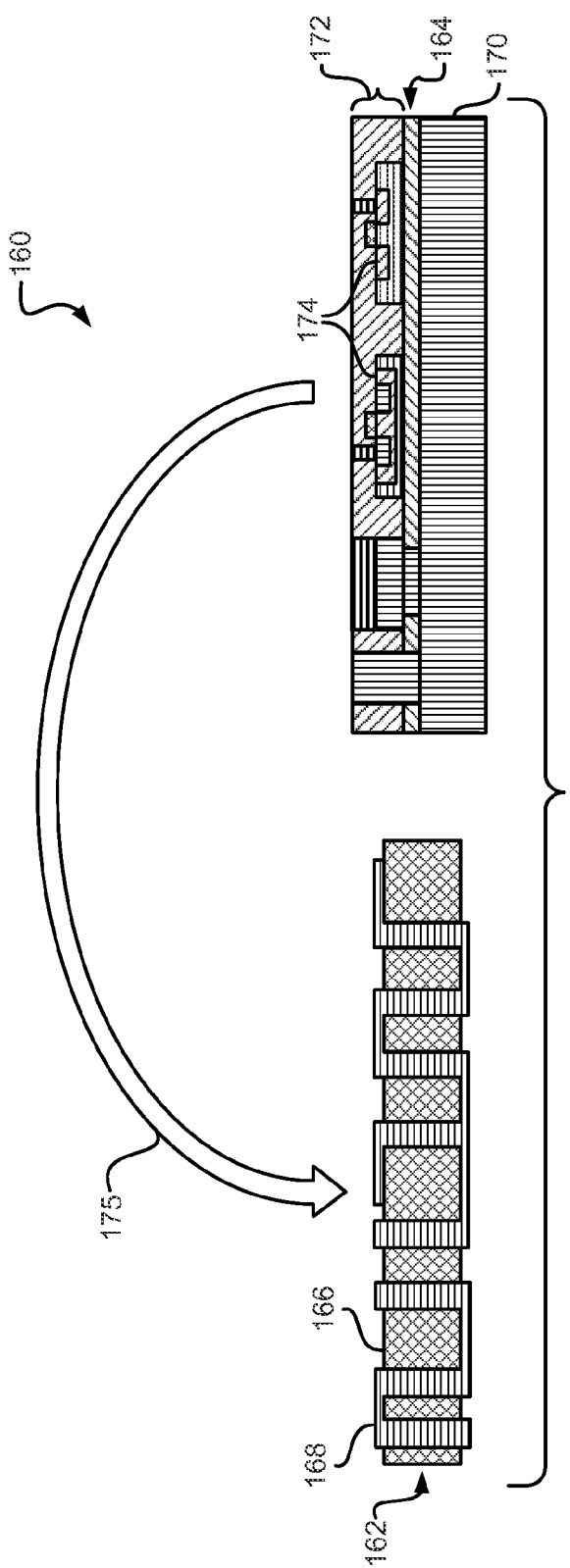
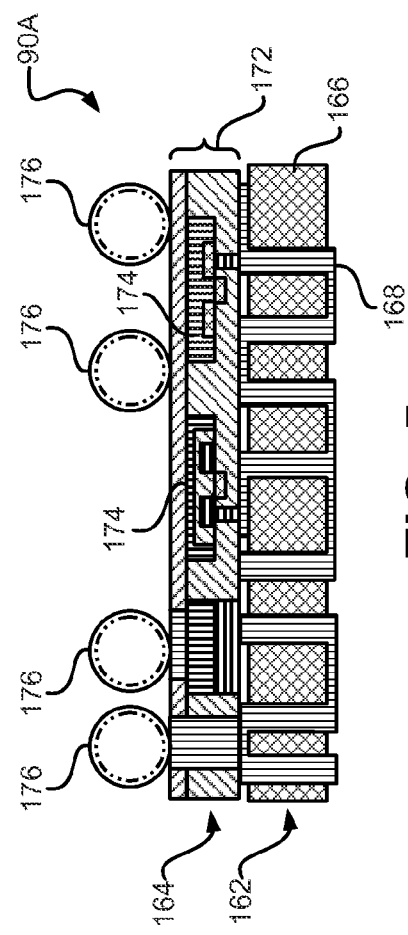

TUNABLE DIPLEXERS IN THREE-DIMENSIONAL (3D) INTEGRATED CIRCUITS (IC) (3DIC) AND RELATED COMPONENTS AND METHODS

RELATED APPLICATIONS

The present application is related to U.S. Provisional Patent Application Ser. No. 61/751,539 filed on Jan. 11, 2013 and entitled "DIPLEXER DESIGN USING THROUGH GLASS VIA TECHNOLOGY," which is incorporated herein by reference in its entirety.

The present application is also related to the utility conversion of the '539 application, namely U.S. patent application Ser. No. 13/798,733, filed on Mar. 13, 2013, and entitled "DIPLEXER DESIGN USING THROUGH GLASS VIA TECHNOLOGY," which is also incorporated herein by reference in its entirety.

BACKGROUND

I. Field of the Disclosure

The technology of the disclosure relates generally to integrated circuits, and particularly to diplexer designs in an integrated circuit.

II. Background

The wireless communication industry continues to work towards providing as much bandwidth to consumers as possible. To this end, many wireless carriers have adopted carrier aggregation policies for current generation communications. That is, a wireless carrier such as AT&T® may own rights to two frequency hands (e.g., 700 MHz and 2 GHz) in a particular geographic area. To maximize available bandwidth, the wireless carrier may use both frequencies simultaneously for a single communication stream. While this does increase the amount of data that can be provided to the end user, there are complications in that each of the frequencies used to transmit data creates noise at the harmonic frequencies. In the AT&T example, the 700 MHz transmissions create harmonics at 2.1 GHz which may interfere with data being broadcast at the 2 GHz frequencies. In such situations, a diplexer can help process signals carried in a carrier aggregation system. In a chipset for a device using such a carrier aggregation system, the diplexer is usually inserted between an antenna and a tuner (or a radio frequency (RF) switch) to ensure high performance. Usually, a diplexer design includes inductors and capacitors. Diplexers can attain high performance by using inductors and capacitors that have a high quality (Q) factor. High performance diplexers can also be attained by reducing the electromagnetic coupling between components, which may be achieved through an arrangement of the geometry and direction of the components. Diplexer performance may be quantified, by measuring the insertion loss and rejection (e.g., quantities expressed in decibels (dB)) at certain frequencies.

Fabricating high performance diplexers in an efficient and cost-effective manner is problematic as the materials required to achieve the high Q may not lend themselves to easy manufacturing processes. Reducing the electromagnetic coupling between the various components in the diplexer, while decreasing the size of the diplexer and making the most economical use of resources, would be beneficial.

The previously incorporated related application provides several ways to make diplexers suitable for a single wireless carrier. However, wireless device manufacturers may desire to make wireless devices that work with multiple carriers. Unfortunately, the wireless carriers do not operate at the same frequency bands and a diplexer optimized to work with one set of frequency bands may be unsuitable for a different set of frequency bands. Thus, there needs to be a way to allow a transceiver to work with multiple frequency bands for multiple carrier aggregation schemes.

SUMMARY OF THE DISCLOSURE

Embodiments disclosed in the detailed description include tunable diplexers in three-dimensional (3D) integrated circuits (IC) (3DIC). Related components and methods are also disclosed. The tunable diplexer may be formed by providing one of either a varactor or a variable inductor in the diplexer. The variable nature of the varactor or the variable inductor allows a notch in the diplexer to be tuned so as to select a band stop to eliminate harmonics at a desired frequency as well as control the cutoff frequency of the pass band. By stacking the elements of the diplexer into three dimensions, space is conserved and a variety of varactors and inductors are able to be used. In a first embodiment, the 3DIC is created through a substrate transfer. In a second embodiment, the 3DIC is created through a die stacking process.

In this regard in one embodiment, a 3DIC is disclosed. The 3DIC includes a first tier comprising at least one inductor. The 3DIC also includes a second tier comprising at least one varactor coupled to the at least one inductor, the at least one inductor and the at least one varactor collectively forming a tunable diplexer.

In another embodiment, a method of forming a tunable diplexer is disclosed. The method includes forming an inductor in a first tier of a 3DIC. The method also includes forming a varactor in a second tier of the 3DIC. The method also includes electrically coupling the varactor to the inductor in the 3DIC such that the inductor and the varactor form a filter for the tunable diplexer.

In another embodiment, a 3DIC is disclosed. The 3DIC includes a first tier comprising at least one means for inducting. The 3DIC also includes a second tier comprising at least one means for providing variable capacitance coupled to the at least one means for inducting, the at least one means for inducting and the at least one means for providing variable capacitance collectively forming a tunable diplexer.

In another embodiment, a tunable diplexer IC is disclosed. The tunable diplexer IC includes a first frequency port configured to transceive first signals having a first frequency band. The tunable diplexer IC also includes a second frequency port configured to transceive second frequency signals having a second frequency band outside of the first frequency band. The tunable diplexer IC also includes an antenna port. The tunable diplexer IC also includes a first pass filter configured to pass signals within the first frequency hand between the first frequency port and the antenna port. The tunable diplexer IC also includes a second pass filter configured to pass signals within the second frequency band between the second frequency port and the antenna port. The tunable diplexer IC also includes at least one notch filter comprising at least one of: a varactor and a variable inductor, the at least one notch filter configured to provide a tunable notch band between at least two of the first frequency port, the second frequency port, and the antenna port.

BRIEF DESCRIPTION OF THE FIGURES

FIG. 4 is a simplified side view of an exemplary embodiment of a three-dimensional (3D) integrated circuit (IC) (3DIC) during assembly of a diplexer according to embodiments of the present disclosure;

FIG. 5 is a simplified side view of the 3DIC at a further stage of assembly according to embodiments of the present disclosure;

DETAILED DESCRIPTION

Figure 1A:
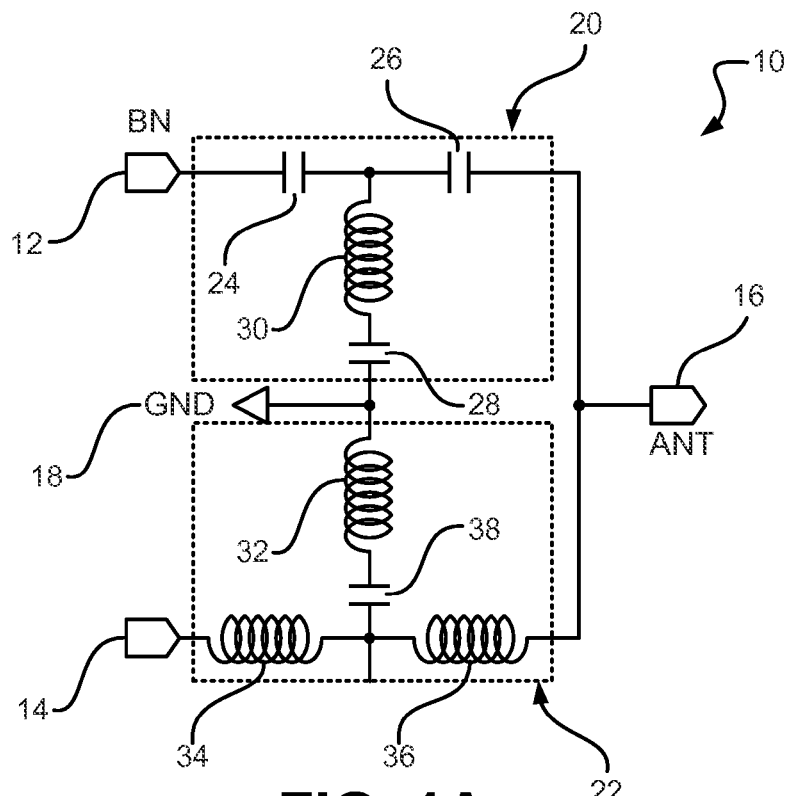
FIG. 1A is a schematic diagram of an exemplary conventional diplexer.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include tunable diplexers in three-dimensional (3D) integrated circuits (IC) (3DIC). Related components and methods are also disclosed. The tunable diplexer may be formed by providing one of either a varactor or a variable inductor in the diplexer. The variable nature of the varactor or the variable inductor allows a notch in the diplexer to be tuned so as to select a band stop to eliminate harmonics at a desired frequency as well as control the cutoff frequency of the pass band. By stacking the elements of the diplexer into three dimensions, space is conserved and a variety of varactors and inductors are able to be used. In a first embodiment, the 3DIC is created through a substrate transfer. In a second embodiment, the 3DIC is created through a die stacking process.

By providing a diplexer with a variable inductor or a varactor, the notch frequency of the bandstop and the cutoff frequency of the passband may be adjusted as desired such that the diplexer may work with multiple carrier aggregation systems. Thus, for example, a mobile terminal such as a cell phone could be made that operated with carrier aggregation systems for different wireless carriers.

Figure 1B:
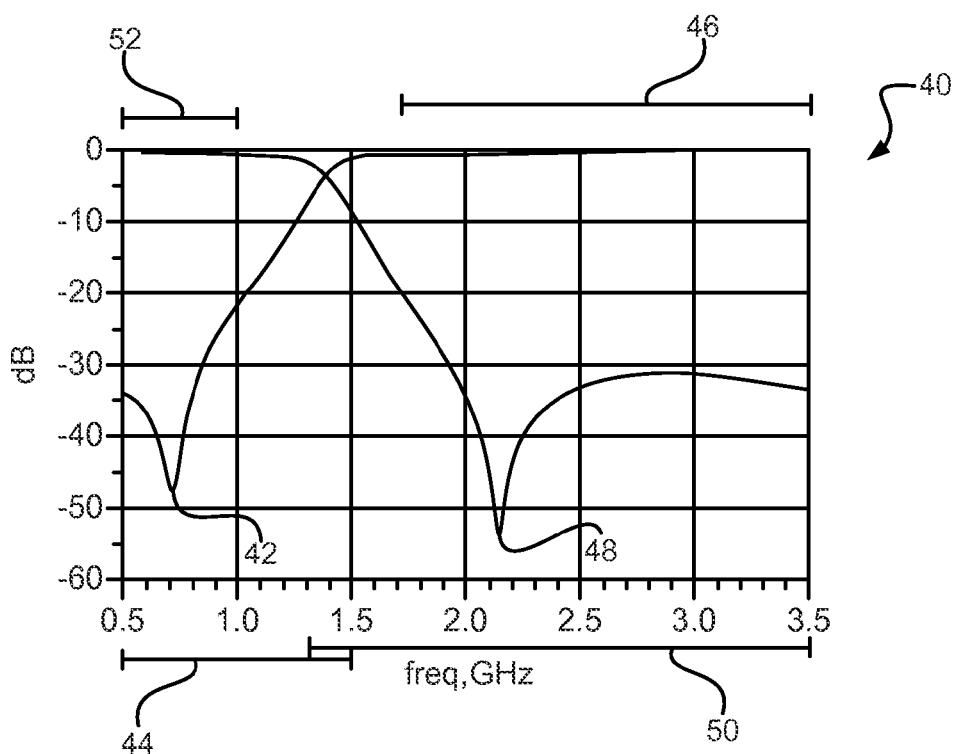
FIG. 1B is a graph of a typical frequency response for the diplexer of FIG. 1A.
Figure 1C:
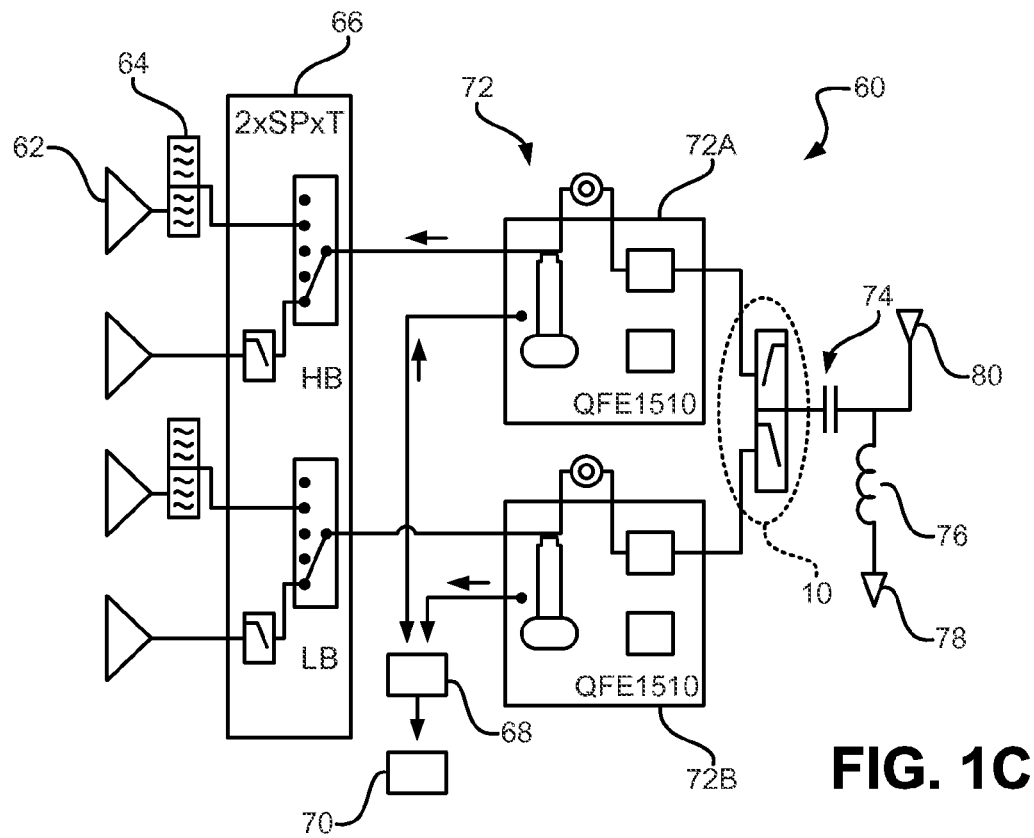
FIG. 1C is a schematic diagram of an exemplary chip set employing a diplexer.

Before addressing exemplary embodiments of tunable diplexers in 3DIC, a brief overview of a conventional diplexer is provided with reference to FIGS. 1A-1C. Embodiments of tunable diplexers according to exemplary embodiments of the present disclosure begin below with reference to FIG. 2A.

In this regard, FIG. 1A is a schematic diagram of a conventional diplexer 10 that includes a first port 12, a second port 14, and an antenna port 16. An additional port to ground 18 may be provided. Between the first port 12 and the antenna port 16 is a high pass (HP) filter 20. Similarly, between the second port 14 and the antenna port 16 is a low pass (LP) filter 22. The HP filter 20 includes a first HP capacitor 24, a second HP capacitor 26, a third HP capacitor 28, and an HP inductor 30. Together, the first HP capacitor 24 and the HP inductor 30 define the high frequencies of the HP filter 20. Likewise, the third HP capacitor 28 and the HP inductor 30 define the notch frequency of the bandstop. The second HP capacitor 26 helps define the steepness of the cutoff frequency for the passband. Note that the inductors described herein are sometimes referred to as a means for inducting. Likewise, the capacitors described are sometimes referred to herein as means for providing capacitance and the varactors described herein are sometimes referred to herein as means for providing variable capacitance.

With continued reference to FIG. 1A, the LP filter 22 includes a first LP inductor 32, a second LP inductor 34, a third LP inductor 36, and a LP capacitor 38. Together, the second LP inductor 34 and the LP capacitor 38 define the low frequencies of the LP filter 22. Likewise, the first LP inductor 32 and the LP capacitor 38 define the notch frequency of the bandstop. The third LP inductor 36 helps define the steepness of the cutoff frequency for the passband.

A graph 40 of an exemplary frequency response from a diplexer according to the previously incorporated application is provided in FIG. 1B. As is readily seen, the HP filter 20 has a notch 42 at 710 MHz for the bandstop 44. The HP passband 46 begins at approximately 1.710 GHz. Likewise, the LP filter 22 has a notch 48 at 2.130 GHz for the bandstop 50. The LP passband 52 ends at about 1.040 GHz. While graph 40 represents an exemplary frequency response for a diplexer made according to the concepts set forth in the previously incorporated application, such a diplexer works for just one wireless carrier aggregation system. That is, while the diplexer may work well for one carrier, a second carrier may need notches at different frequencies to block unwanted harmonics. Thus, there remains a need for a diplexer that facilitates use of a chip set across multiple wireless carriers and is adaptable to a plurality of wireless carrier aggregation systems.

In the interests of completeness, it should be appreciated that a diplexer such as diplexer 10 may be positioned in a chip set 60 for a transceiver as illustrated in FIG. 1C. The chip set 60 includes a power amplifier 62, a duplexer/filter 64, a radio frequency (RF) switch module 66, a passive combiner 68, a receiver 70, a tuner circuitry 72 (e.g., a first tuner circuitry 72A and a second tuner circuitry 72B), a diplexer 10, a capacitor 74, an inductor 76, a ground terminal 78 and an antenna 80. The power amplifier 62 amplifies signal(s) to a certain power level for transmission. The duplexer/filter 64 filters the input/output signals according to a variety of different parameters, including frequency, insertion loss, rejection or other like parameters. The RF switch module 66 may select certain portions of the input signals to pass on to the rest of the chip set 60. The passive combiner 68 combines the detected power from the first tuner circuitry 72A and the second tuner circuitry 72B. The receiver 70 processes the information from the passive combiner 68 and uses this information to further operate the chip set 60. The tuner circuitry 72 includes components such as a tuner, a portable data entry terminal (PDET), and a house keeping analog to digital converter (HKADC). The tuner circuitry 72 may perform impedance tuning (e.g., a voltage standing wave ratio (VSWR) optimization) for the antenna 80.

As shown in FIG. 1C, the diplexer 10 is between the tuner component of the tuner circuitry 72 and the capacitor 74, the inductor 76, and the antenna 80. The diplexer 10 may be placed between the antenna 80 and the tuner circuitry 72 to provide high system performance for the chip set 60. The diplexer 10 also performs frequency domain multiplexing on both high band frequencies and low band frequencies. After the diplexer 10 performs its frequency multiplexing functions on the input signals, the output of the diplexer 10 is fed to an optional LC (inductor/capacitor) network including the capacitor 74 and the inductor 76. The LC network may provide extra impedance matching components for the antenna 80, when desired. Then a signal with the particular frequency is transmitted or received by the antenna 80.

The present disclosure provides a diplexer capable of use across multiple wireless carrier aggregation systems through the introduction of high Q variable reactive elements in the diplexer. By varying the capacitance or inductance of the elements within the diplexer, the notch and cutoff frequencies may be varied as needed to meet the needs of a particular carrier aggregation system. The present disclosure provides structures, methods, and techniques to provide suitably high Q elements without sacrificing area within the chip set, without creating unnecessary power drains, and without creating unwanted parasitics between elements.

Figure 2A:
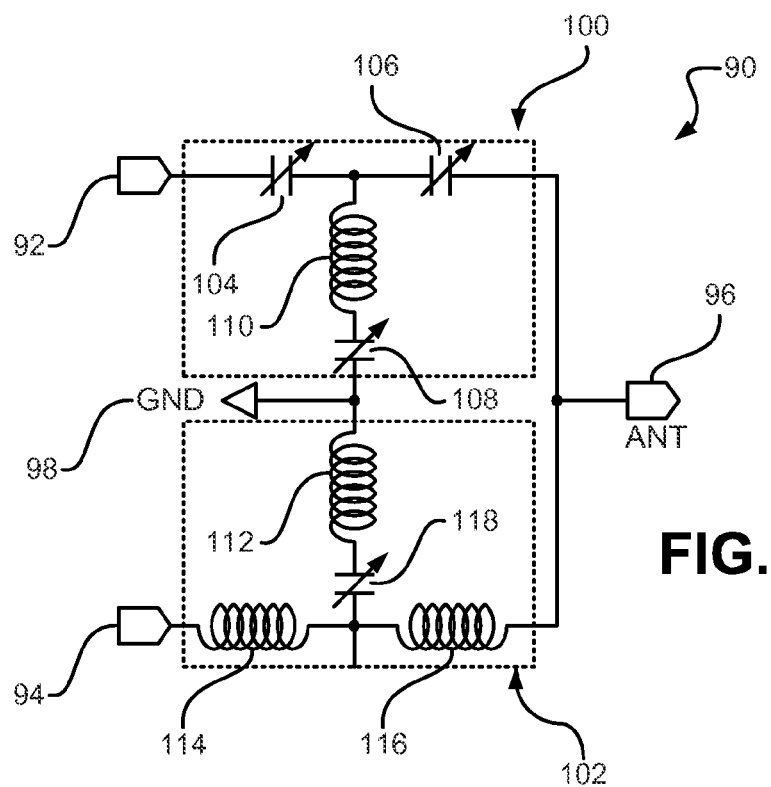
FIG. 2A is a schematic diagram of a diplexer according to an exemplary embodiment of the present disclosure.

In this regard, a first embodiment of a diplexer 90 is illustrated in FIG. 2A. The diplexer 90 includes a first port 92, a second port 94, and an antenna port 96. An additional port to ground 98 may be provided. Between the first port 92 and the antenna port 96 is a variable HP filter 100. Similarly, between the second port 94 and the antenna port 96 is a variable LP filter 102. The variable HP filter 100 includes a first HP varactor 104, a second HP varactor 106, a third HP varactor 108, and an HP inductor 110. Together, the first HP varactor 104 and the HP inductor 110 define the high frequencies of the variable HP filter 100. Likewise, the third HP varactor 108 and the HP inductor 110 define the notch frequency of the bandstop. The second HP varactor 106 helps define the steepness of the cutoff frequency for the passband.

With continued reference to FIG. 2A, the variable LP filter 102 includes a first L1 inductor 112, a second LP inductor 114, a third L1 inductor 116, and a LP varactor 118. Together, the second LP inductor 114 and the LP varactor 118 define the low frequencies of the variable LP filter 102. Likewise, the first LP inductor 112 and the LP varactor 118 define the notch frequency of the bandstop. The third LP inductor 116 helps define the steepness of the cutoff frequency for the passband.

With continued reference to FIG. 2A, the inductors 110, 112, 114, and 116 may be formed as through glass via (TGV) inductors or through substrate via (TSV) inductors in general. For more information on TGV and TSV inductors, the interested reader is directed to the previously incorporated application. While TSV inductors provide a Q of around thirty (30) or higher at 1 GHz, TGV inductors may provide a Q of greater than sixty (60) at 1 GHz, and/or provide a Q greater than one hundred (100) at 2 GHz. Thus, TGV inductors provide high Q inductance, which in turn provides the notch and passband characteristics needed to effectuate a diplexer that works with multiple carrier aggregation systems. In an exemplary embodiment, the varactors 104, 106, 108, and 118 are silicon on insulator (SOI) varactors and in a specifically contemplated exemplary embodiment, the varactors are silicon on glass (SOG) varactors. For more information about possible varactors, the interested reader is referred to "'DISTORTION-FREE' VARACTOR DIODE TOPOLOGIES FOR RF ADAPTIVITY" by Buisman et al., *Microwave Symposium Digest*, 2005 IEEE MTT-S International, © 2005, IEEE. The Buisman et al. paper is incorporated herein by reference in its entirety.

Figure 2B:
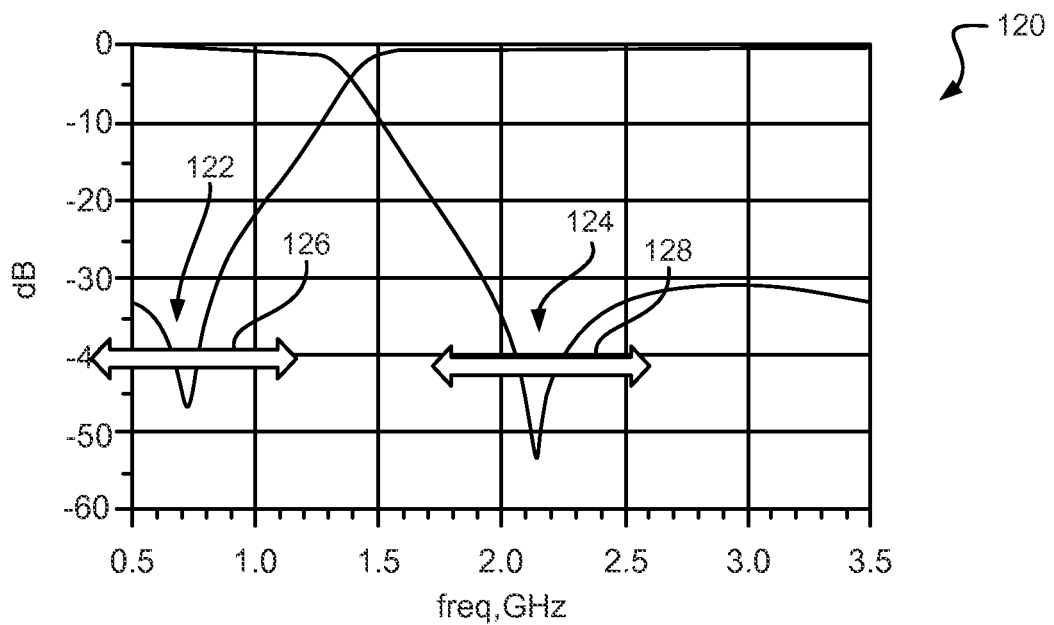
FIG. 2B is a graph of a typical frequency response for the diplexer of FIG. 2A.

In this regard, FIG. 2B illustrates a graph 120 of a typical frequency response for the diplexer 90. In particular, the notches 122 and 124 may vary as indicated by arrows 126 and 128 respectively depending on the varactors 104, 106, 108, and 118. That is, by varying the capacitance of the varactors 104, 106, 108, and 118, the notches 122, 124 may be moved, effectively changing the frequency of the bandstop. Note that while all the capacitive elements are shown as varactors 104, 106, 108, and 118, it is possible that only a subset of the capacitive elements comprise varactors. For example, varactors 104 and 106 may be replaced by non-varying capacitors. While this substitution is possible and within the scope of the present disclosure, the frequency response of a diplexer having only varactors 108, 118 may be less optimal than one having four varactors 104, 106, 108, and 118.

Figure 3:
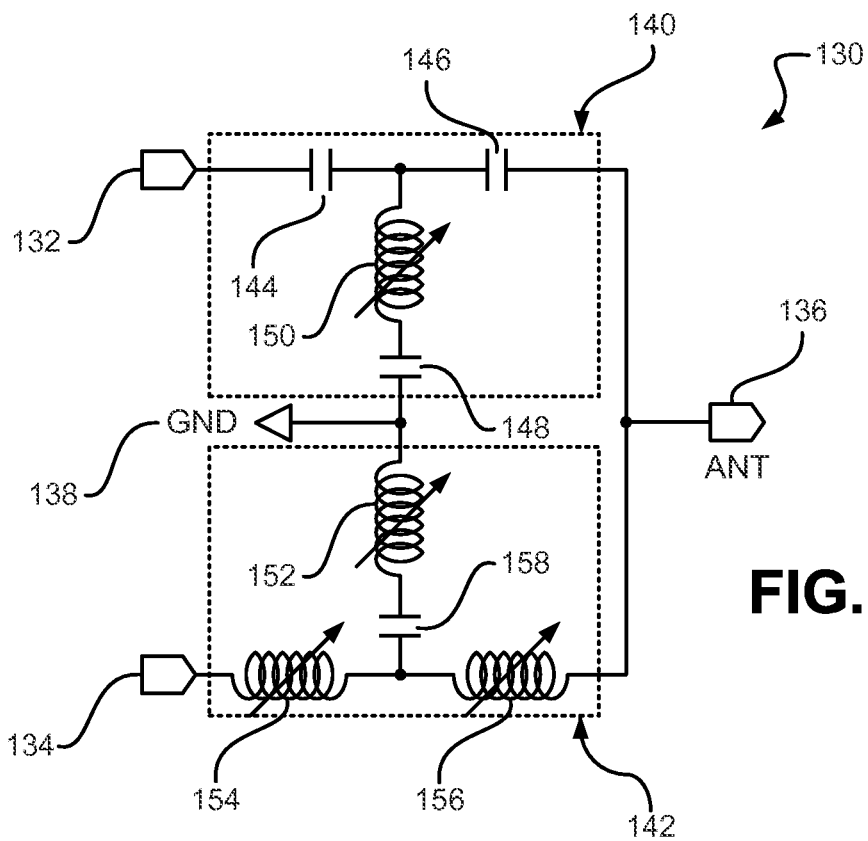
FIG. 3 is a schematic diagram of a diplexer according to an alternate exemplary embodiment of the present disclosure.

While varactors 104, 106, 108, and 118 are suitable to vary the notches 122, 124, the present disclosure is not so limited. Instead of varactors 104, 106, 108, and 118, variable inductors may be used instead as better illustrated in FIG. 3. A diplexer 130 is illustrated in FIG. 3. The diplexer 130 includes a first port 132, a second port 134, and an antenna port 136. An additional port to ground 138 may be provided. Between the first port 132 and the antenna port 136 is a variable HP filter 140. Similarly, between the second port 134 and the antenna port 136 is a variable LP filter 142. The HP filter 140 includes a first HP capacitor 144, a second HP capacitor 146, a third HP capacitor 148, and a variable HP inductor 150. Together, the first HP capacitor 144 and the variable HP inductor 150 define the high frequencies of the HP filter 140. Likewise, the third HP capacitor 148 and the HP inductor 150 define the notch frequency of the bandstop. The second HP capacitor 146 helps define the steepness of the cutoff frequency for the passband.

With continued reference to FIG. 3, the variable LP filter 142 includes a first variable LP inductor 152, a second variable LP inductor 154, a third variable LP inductor 156, and a LP capacitor 158. Together, the second variable LP inductor 154 and the LP capacitor 158 define the low frequencies of the variable LP filter 142. Likewise, the first variable LP inductor 152 and the LP capacitor 158 define the notch frequency of the bandstop. The third variable LP inductor 156 helps define the steepness of the cutoff frequency for the passband. It should be appreciated that while variable inductors can be used, their use eliminates many of the manufacturing efficiencies and space conserving properties that make diplexer 90 viable in contemporary chip sets for portable devices. Further, it should be noted that while not illustrated, both the inductive elements and the capacitive elements could be variable in the same device. That is, varactors and variable inductors could be used in the same diplexer for some or all of the reactive elements.

There are at least, two techniques through which a diplexer such as diplexer 90 or 130 can be formed. The first technique is a substrate transfer (illustrated in FIGS. 4 and 5) and the second technique is through a die stacking process (illustrated in FIG. 7). In this regard, FIG. 4 illustrates a simplified side view of an unassembled diplexer 160 that is an intermediary stage during the creation of a diplexer 90 through a substrate transfer. The unassembled diplexer 160 has a first tier 162 and a second tier 164. The first tier 162 may include a glass substrate 166 with conductive elements 168 formed therethrough to form one or more inductors such as inductors 110, 112, 114, and 116. The conductive elements 168 may, in an exemplary embodiment, be TGV elements. If the substrate is silicon instead of glass substrate 166, the conductive elements 168 may be TSV elements.

With continued reference to FIG. 4, the second tier 164 may comprise a substrate 170 and an active region 172 with one or more varactors therein. The varactors 174 may be varactors 104, 106, 108, and 118. As noted above, the varactors 174 may be SOI or SOG varactors. Alternatively, the varactors could be formed from a SOI or silicon on sapphire (SOS) switchable capacitor bank or a MEMS switchable capacitor bank. SOG varactors have the highest Q at the frequencies of interest, but the other varactors may be appropriate for different engineering constraints.

Bridging between FIGS. 4 and 5, the second tier 164 is flipped onto the first tier 162 as evidenced by arrow 175 and the excess substrate 170 is removed. By positioning the varactors 174 within the second tier 164 so close to the inductors of the first tier 162, power draining parasitics are avoided and extra connections are avoided which generally improves the Q of the elements within the diplexer. Additionally, the overall area of the diplexer is reduced making the diplexer more attractive to circuit designers who are dealing with continued miniaturization pressures.

With continued reference to FIG. 5, after removal of the excess substrate 170, contacts 176 may be provided, such as wafer level chip scale package (WLCSP) balls and the unassembled diplexer 160 is now a diplexer 90A similar to diplexer 90 discussed above. Other contacts may be provided if desired.

Figure 6:
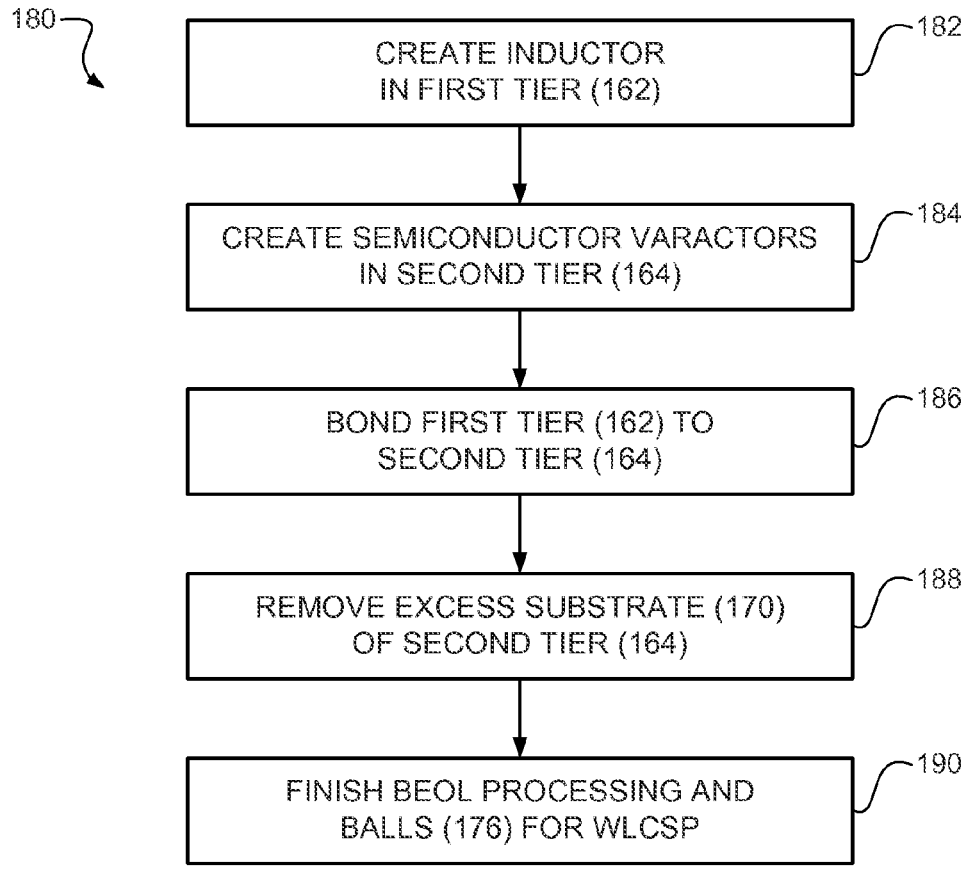
FIG. 6 is a flow chart representing an exemplary manufacturing process for embodiments of the present disclosure.

The process 180 of forming the diplexer 90A of FIG. 5 is set forth in FIG. 6. Initially, the process 180 begins by creating an inductor in a substrate 166 in the first tier 162 (block 182). Simultaneously or sequentially, semiconductor varactors are created in the second tier 164 (block 184). The second tier 164 is flipped onto the first tier 162 and bonded thereto (block 186). The excess substrate 170 is removed from the second tier 164 (block 188). Then the process 180 finishes the back end of line (BEOL) processing and provides the WLCSP balls (i.e. contacts 176).

Figure 7:
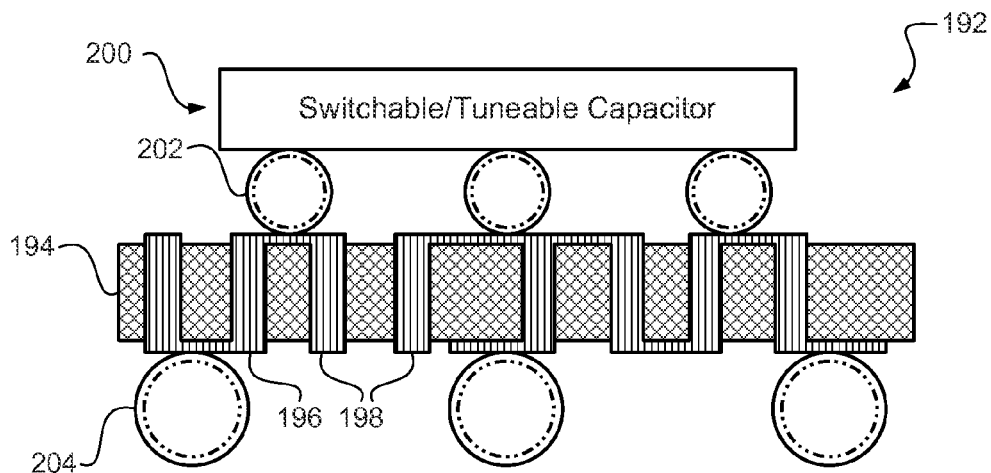
FIG. 7 is a simplified side view of a second exemplary embodiment of an assembly process of a diplexer according to embodiments of the present disclosure.

While the process 180 generates suitable diplexers, other processes may also be used such as die stacking. In this regard, FIG. 7 provides an illustration of a die stacked diplexer 192. The diplexer 192 includes a first tier 194 having a substrate 196 such as a glass substrate and conductive elements 198 therethrough so as to form an inductor such as a TGV inductor. The diplexer 192 further includes a second tier 200 with variable capacitance elements therein such as SOG varactors, a SOI or SOS switchable capacitor bank or a MEMS switchable capacitor bank. The first tier 194 is bonded to the second tier 200 through flip chip bumps 202 and balls 204, such as WLCSP balls, which may be used to facilitate the multi-die stack for connection to a printed circuit board (PCB).

The tunable diplexers in 3DIC and related components and methods according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 8:
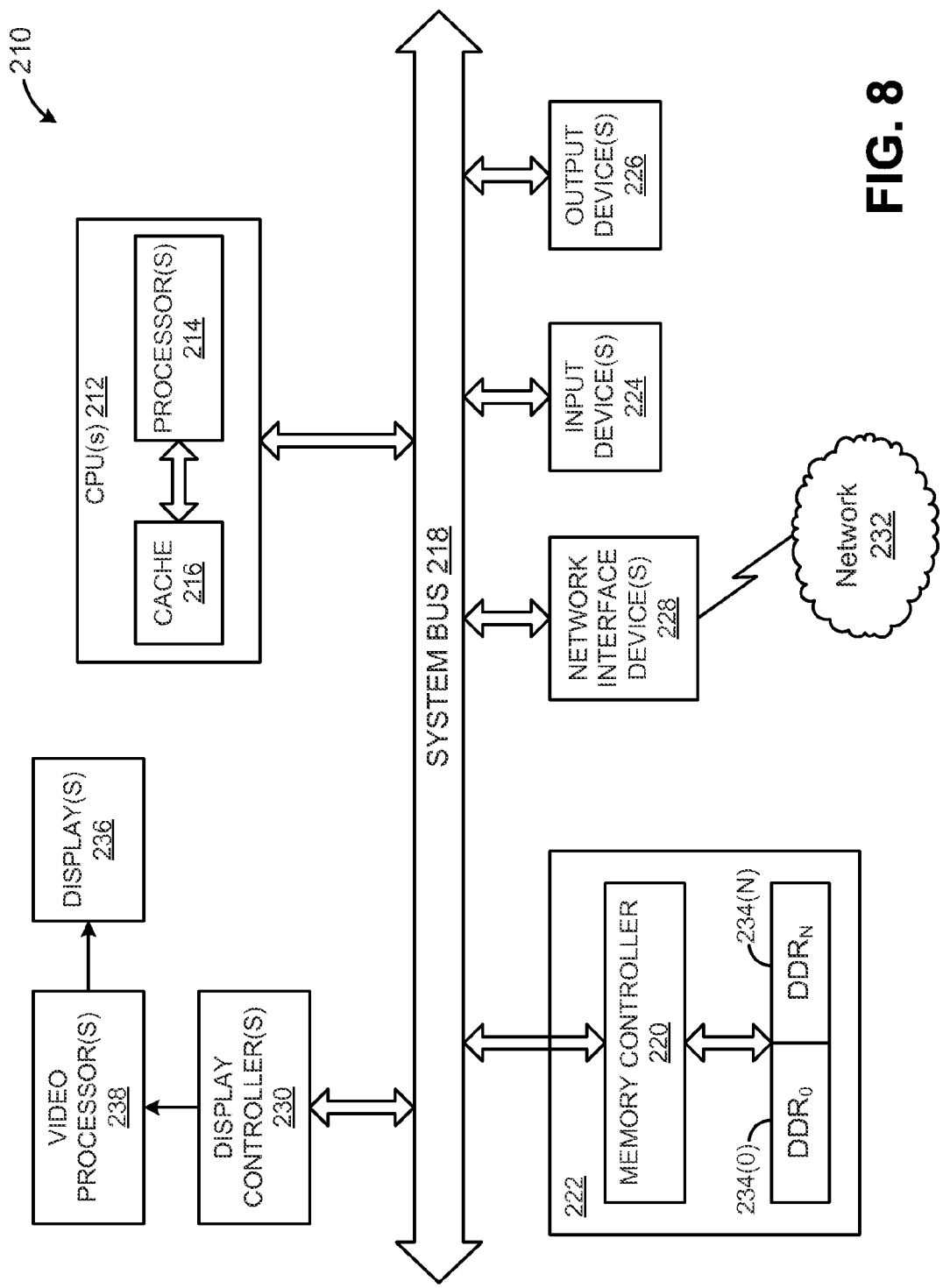
FIG. 8 is a block diagram of an exemplary processor-based system that can include the diplexer of FIG. 2A or 3.

In this regard, FIG. 8 illustrates an example of a processor-based system 210 that can employ diplexers 90, 90A, 130, 192 illustrated in FIGS. 2A, 3, and 7. The diplexers 90, 90A, 130, 193 may be incorporated into a semiconductor die or otherwise used in such a processor-based system 210. In this example, the processor-based system 210 includes one or more central processing units (CPUs) 212, each including one or more processors 214. The CPU(s) 212, may be a master device. The CPU(s) 212 may have cache memory 216 coupled to the processor(s) 214 for rapid access to temporarily stored data. The CPU(s) 212 is coupled to a system bus 218 and can intercouple master devices and slave devices included in the processor-based system 210. As is well known, the CPU(s) 212 communicates with these other devices by exchanging address, control, and data information over the system bus 218. For example, the CPU(s) 212 can communicate bus transaction requests to the memory controller 220 as an example of a slave device. Although not illustrated in FIG. 8, multiple system buses 218 could be provided, wherein each system bus 218 constitutes a different fabric.

Other master and slave devices can be connected to the system bus 218. As illustrated in FIG. 8, these devices can include a memory system 222, one or more input devices 224, one or more output devices 226, one or more network interface devices 228, and one or more display controllers 230, as examples. The input device(s) 224 can include any type of input device, including but not limited to input keys, switches, voice processors, etc. The output device(s) 226 can include any type of output device, including but not limited to audio, video, other visual indicators, etc. The network interface device(s) 228 can be any devices configured to allow exchange of data to and from a network 232. The network 232 can be any type of network, including but not limited to a wired or wireless network, private or public network, a local area network (LAN), a wide local area network (WLAN), and the Internet. The network interface device(s) 228 can be configured to support any type of communication protocol desired. The memory system 222 can include one or more memory units 234 (0-N).

The CPU(s) 212 may also be configured to access the display controller(s) 230 over the system bus 218 to control information sent to one or more displays 236. The display controllers) 230 sends information to the display(s) 236 to be displayed via one or more video processors 238, which process the information to be displayed into a format suitable for the display(s) 236. The display(s) 236 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A three-dimensional (3D) integrated circuit (IC) (3DIC), comprising:
    a first tier comprising at least one inductor, wherein the at least one inductor comprises a through substrate via inductor, wherein the through substrate via inductor comprises a high Q inductor, wherein Q is greater than or equal to thirty at 1 GHz; and
    a second tier comprising at least one varactor coupled to the at least one inductor, the at least one inductor and the at least one varactor collectively forming a tunable diplexer.

2. The 3DIC of claim 1 wherein the at least one varactor comprises a silicon on glass (SOG) varactor.

3. The 3DIC of claim 1 wherein the through substrate via inductor comprises a through glass via (TGV) inductor.

4. The 3DIC of claim 1 wherein the at least one inductor and the at least one varactor form a low pass (LP) filter within the tunable diplexer.

5. The 3DIC of claim 1 further comprising a second varactor positioned in the second tier coupled to a plurality of second inductors in the first tier, the second varactor and the plurality of second inductors collectively forming a low pass (LP) filter of the tunable diplexer.

6. The 3DIC of claim 1 wherein the at least one varactor is configured to adjust a notch frequency of a filter within the tunable diplexer.

7. The 3DIC of claim 1 wherein the through substrate via inductor is configured to control a cutoff frequency for a filter within the tunable diplexer.

8. The 3DIC of claim 1 integrated into a semiconductor die.

9. The 3DIC of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

10. A method of forming a tunable diplexer, comprising:
    forming a through substrate inductor in a first tier of a three-dimensional (3D) integrated circuit (IC) (3DIC) wherein the through substrate inductor comprises a high Q inductor, wherein Q is greater than or equal to thirty at 1 GHz;
    forming a varactor in a second tier of the 3DIC; and
    electrically coupling the varactor to the through substrate inductor in the 3DIC such that the through substrate inductor and the varactor form a filter for a tunable diplexer.

11. The method of claim 10 wherein electrically coupling the varactor to the through substrate inductor comprises effectuating a substrate transfer and using metal-to-metal bonding.

12. The method of claim 10 wherein electrically coupling the varactor to the through substrate inductor comprises die stacking the second tier on the first tier and using a flip-chip bump.

13. The method of claim 10 wherein forming the through substrate inductor comprises forming a through glass via (TGV) inductor.

14. The method of claim 10 wherein forming the varactor in the second tier comprises forming a silicon on glass (SOG) varactor.

15. A three-dimensional (3D) integrated circuit (IC) (3DIC), comprising:
- a first tier comprising at least one through substrate via inductor wherein the at least one through substrate via inductor comprises a high Q inductor, wherein Q is greater than or equal to thirty at 1 GHz; and
- a second tier comprising at least one means for providing variable capacitance coupled to the at least one through substrate via inductor, the at least one through substrate via inductor and the at least one means for providing variable capacitance collectively forming a tunable diplexer.

16. A tunable diplexer integrated circuit (IC), comprising:
- a first frequency port configured to transceive first signals having a first frequency band;
- a second frequency port configured to transceive second frequency signals having a second frequency band outside of the first frequency band;
- an antenna port;
- a first pass filter configured to pass signals within the first frequency band between the first frequency port and the antenna port;
- a second pass filter configured to pass signals within the second frequency band between the second frequency port and the antenna port; and
- at least one notch filter comprising at least one of: a varactor and a variable through substrate via inductor, the at least one notch filter configured to provide a tunable notch band between at least two of the first frequency port, the second frequency port, and the antenna port, wherein the variable through substrate via inductor comprises a high Q inductor, wherein Q is greater than or equal to thirty at 1 GHz.

17. The tunable diplexer IC of claim 16 wherein the varactor comprises a high Q varactor, wherein Q is greater than or equal to one hundred at 2 GHz.

18. The tunable diplexer IC of claim 16 wherein the at least one notch filter is configured to block harmonics of the first signals.

19. The tunable diplexer IC of claim 16 wherein the variable through substrate via inductor comprises a through glass via (TGV) inductor.

* * * * *